(12) United States Patent
Yoshikawa et al.

(10) Patent No.: US 8,183,688 B2
(45) Date of Patent: May 22, 2012

(54) SEMICONDUCTOR DEVICE

(75) Inventors: Yasuhiro Yoshikawa, Tokyo (JP);
Motoo Suwa, Tokyo (JP); Kazuyuki Sakata, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/023,401

(22) Filed: Feb. 8, 2011

(65) Prior Publication Data
US 2011/0127671 A1    Jun. 2, 2011

Related U.S. Application Data

(63) Continuation of application No. 12/795,637, filed on Jun. 7, 2010, now Pat. No. 7,888,795, which is a continuation of application No. 12/020,442, filed on Jan. 25, 2008, now Pat. No. 7,750,464.

(30) Foreign Application Priority Data

Mar. 30, 2007    (JP) ................................ 2007-092591

(51) Int. Cl.
    *H01L 23/50* (2006.01)
(52) U.S. Cl. .. 257/723; 257/724; 257/777; 257/E23.169
(58) Field of Classification Search .................. 257/723, 257/724, 777, E23.169
    See application file for complete search history.

(56) References Cited

U.S. PATENT DOCUMENTS

| | | | |
|---|---|---|---|
| 5,815,427 A * | 9/1998 | Cloud et al. | 365/51 |
| 5,862,147 A * | 1/1999 | Terauchi | 714/718 |
| 6,255,899 B1 | 7/2001 | Bertin et al. | |
| 6,262,488 B1 | 7/2001 | Masayuki et al. | |
| 6,791,192 B2 | 9/2004 | Lin et al. | |
| 6,945,465 B2 | 9/2005 | Nishizawa et al. | |
| 7,009,303 B2 | 3/2006 | Kuroda et al. | |
| 7,170,091 B2 * | 1/2007 | Lunde | 257/48 |
| 7,176,506 B2 | 2/2007 | Beroz et al. | |
| 7,224,052 B2 * | 5/2007 | Nishizawa et al. | 257/679 |
| 7,234,644 B2 | 6/2007 | Nishizawa et al. | |
| 7,250,684 B2 * | 7/2007 | Nickerson et al. | 257/777 |
| 7,528,473 B2 | 5/2009 | Suwa et al. | |
| 7,538,418 B2 * | 5/2009 | Nishizawa et al. | 257/679 |
| 7,629,675 B2 | 12/2009 | Briggs et al. | |
| 7,893,530 B2 * | 2/2011 | Hsieh | 257/723 |
| 8,039,318 B1 * | 10/2011 | Briggs et al. | 438/123 |
| 2001/0026008 A1 * | 10/2001 | Tsuneda et al. | 257/668 |
| 2006/0192282 A1 | 8/2006 | Suwa et al. | |

FOREIGN PATENT DOCUMENTS

| JP | 2001-209773 A | 8/2001 |
|---|---|---|
| JP | 2006-237385 A | 9/2006 |

* cited by examiner

*Primary Examiner* — Eugene Lee
(74) *Attorney, Agent, or Firm* — Miles & Stockbridge P.C.

(57) ABSTRACT

There is provided a semiconductor device which makes equalization of wirings between address system chips easy and reduce the influence of crosstalk noise and capacitive coupling noise among data system wirings for connecting the chips. There are mounted, on a module board, a plurality of stacked memory chips which a data processor chip simultaneously accesses. Address system bonding pads to which a plurality of memory chips correspond are commonly coupled by a wire to a bonding lead at one end of the module board wiring whose other end is coupled by a wire to an address system bonding pads of the data processor. Data system bonding pads of the data processor chip are individually coupled to data system bonding pads of the memory chip. With respect to an arrangement of the plurality of data system bonding pads of the data processor chip, an arrangement of the data system bonding pads to which the memory chip, coupled by the data system wiring, corresponds is made such that memory chips are disposed in an alternating sequence.

5 Claims, 14 Drawing Sheets

SEMICONDUCTOR DEVICE

CROSS-REFERENCE TO RELATED APPLICATIONS

The application is a continuation of application Ser. No. 12/795,637 filed Jun. 7, 2010 now U.S. Pat. No. 7,888,795, which is a continuation of application Ser. No. 12/020,442 filed Jan. 25, 2008 (now U.S. Pat. No. 7,750,464 issued Jul. 6, 2010). Also, the disclosure of Japanese Patent Application No. 2007-92591 filed on Mar. 30, 2007 including the specification, drawings and abstract is incorporated herein by reference in its entirety.

BACKGROUND OF THE INVENTION

The present invention relates to a semiconductor device, such as an SIP (System In Package), wherein a memory chip and a data processor chip are mounted on a module board or substrate. In particular, it relates, for instance, to a technique effective to be applied to a resin-sealed semiconductor module of the SIP type.

Described in Patent document 1 is a semiconductor module wherein there are mounted on a module board two DDR2-SDRAMs (Double Data Rate 2-Synchronous Dynamic Random Access Memory) and a data processor which lie flat, respectively. Layouts of data system terminals of the DDR2-SDRAMs with respect to memory access terminals of the data processor are determined in such a manner that wirings for data and a data strobe system (RTdq/dqs) become shorter than wirings for an address/command system (RTcmd/add). The wirings for the data and data strobe system (RTdq/dqs) are laid down using an area defined between the DDR2-SDRAMs. The wirings for the address/command system (RTcmd/add) bypass the side of the module board.

Described in Patent documents 2 is an IC card in which a flash memory chip and a controller chip are stacked and mounted. A bonding wire is used for connecting the flash memory chip with a corresponding terminal of the controller chip.
(Patent document 1)
  Japanese Patent Laid-open No. 2006-237385
(Patent document 2)
  Japanese Patent Laid-open No. 2001-209773

SUMMARY OF THE INVENTION

In a semiconductor module on which a plurality of memory chips and data processor chips are mounted, equalization of wiring lengths between chips and reduction of noise in the wirings between the chips related to data and data strobe signals are further restricted by acceleration of the operating speed and lowering of the operating voltage. With respect to the above, the present inventors performed the following studies. In a structure where a plurality of wiring layers of the module board and a through hole for connecting the wiring layers are used in wiring chips, the through hole cannot be formed at any given position, which restricts the equalization of the wiring lengths between the chips. Further, when the acceleration proceeds, it is not desirable to exclude, as in Patent document 1, the address/command wiring from subjects of length equalization. Further, as described in Patent document 2, when connecting a bonding lead of a wiring pattern on the module board to a bonding pad of the chip with a wire, it is required to reduce the influence of crosstalk noise and capacitive coupling noise between wires. Particularly, when it is required to arrange a plurality of arrays of bonding leads with respect to the bonding pads arranged on one side of the chip, it is necessary to ease the influence of crosstalk and capacitive coupling not only between the right and left sides of the wires but also between upper and lower sides thereof.

It is therefore an object of the present invention is to provide a semiconductor device wherein it is easy to equalize wiring lengths between chips not only of the data system but also of the address system.

Another object of the present invention is to provide a semiconductor device wherein it is possible to ease the influence of crosstalk noise and capacitive coupling noise between the data system wirings of chips.

Another object of the present invention is to provide a semiconductor device wherein it is possible to ease the influence of crosstalk noise and capacitive coupling noise between the data wiring and the strobe signal wiring of chips.

The above and other objects as well as a novel feature of the present invention will be apparent from the description of the present specification and the drawings attached thereto.

A brief summary of a typical example of the invention disclosed in the present application will be given as follows.

Namely, a plurality of memory chips which a data processor chip simultaneously accesses are mounted on a module board in a stacked state. One end of the module substrate wiring is connected to an address system bonding pad of a data processor. A bonding lead of the other end of the module substrate wiring is commonly connected, by a wire, to address system bonding pads to which the memory chips correspond. The data system bonding pads of the data processor chip are individually connected to the data system bonding pads of the memory chips. In particular, with respect to the arrangement of a plurality of data system bonding pads of the data processor chip, the arrangement of the data system bonding pads to which the memory chips connected by the data system wiring correspond are made such that the memory chips are disposed in an alternating sequence.

Now, the effects obtained by the typical example according to the invention disclosed in the present application will be explained briefly.

That is, it is easy to equalize the wiring lengths between chips not only of the data system but also of the address system.

It is possible to ease the influence of crosstalk noise and capacitive coupling noise between data system wirings of chips.

It is possible to ease the influence of crosstalk noise and capacitive coupling noise between the data wiring and the strobe signal wiring of chips.

DESCRIPTION OF THE PREFERRED EMBODIMENTS

1. Summary of Embodiments

Figure 1:
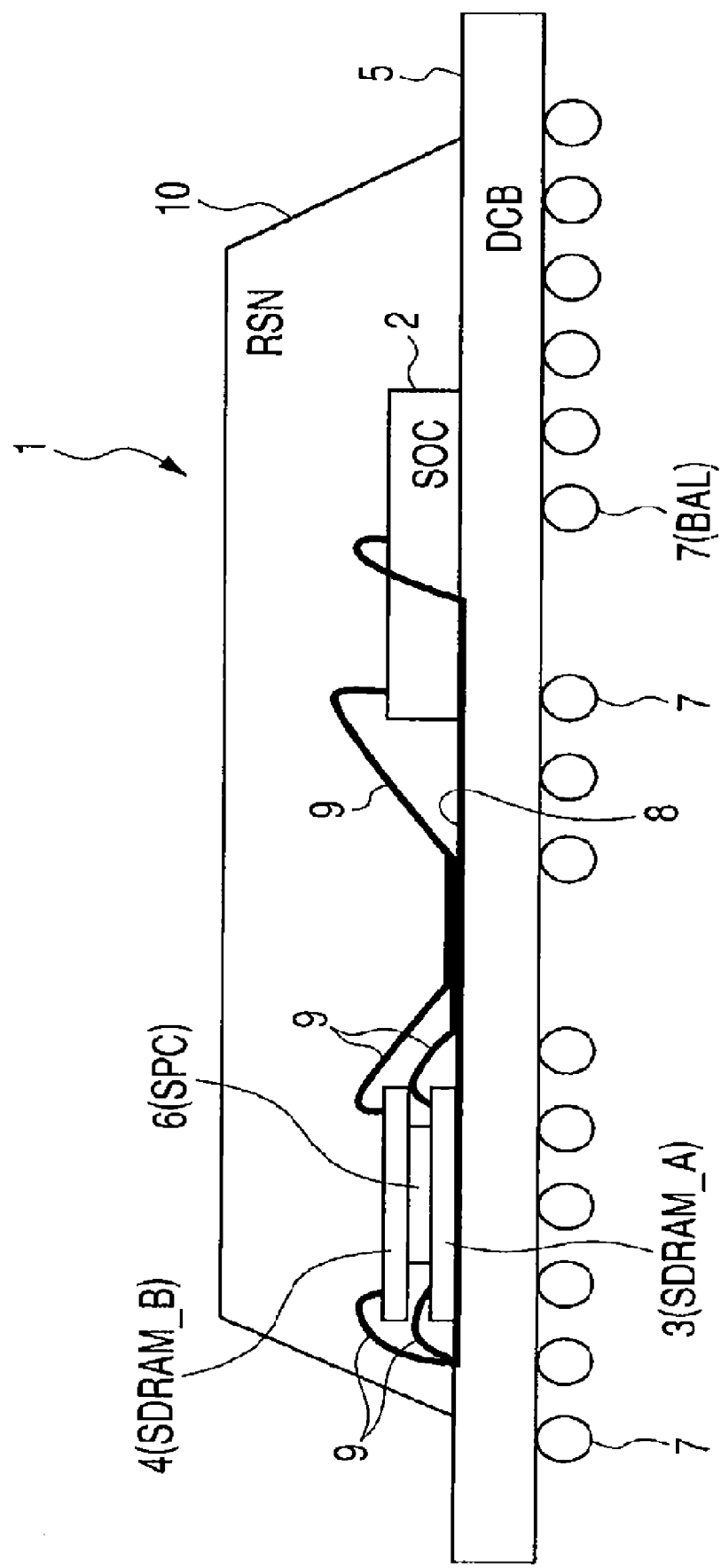
FIG. 1 is a vertical cross-sectional view illustrating a semiconductor device according to the present invention.

First, a typical embodiment of the invention disclosed in the present application will briefly be explained. Referential numerals with parentheses in the drawings to be referred to in the summary of the typical embodiment simply illustrate what are included in the concept of components to which they are attached.

[1] A semiconductor device according to a typical embodiment of the present invention comprises, on its module board (5), a plurality of memory chips (3, 4) in a stacked state and a data processor chip (2) capable of simultaneously accessing the memory chips. A plurality of address system bonding pads (BPpca) related to an address and a command for the data processor chip to access the memory chip are connected, through a common address system wiring (MLca) among the memory chips, to address system bonding pads (BPmca_A, BPmca_B) to which the memory chips correspond. A plurality of data system bonding pads (BPpd4, BPpd2) related to data and a data strobe signal for the data processor chip to access the memory chips are connected, through individual data system wirings (MLd1, MLd2) among the memory chips, to data system bonding pads (BPmd_A, BPmd_B) to which the memory chips correspond. In particular, with respect to an arrangement of a plurality of data system bonding pads of the data processor chip, an arrangement of the data system bonding pads to which the memory chips connected by the data system wiring correspond is made such that the memory chips are disposed in an alternating sequence.

Accordingly, with the plural memory chips stacked, it is easy to extend a single in-the module wiring to be connected to the corresponding address system bonding pads of the data processor chip to the vicinity of the address system bonding pads corresponding to each other among memory chips. The bonding lead (BLmca) which is the extended end of the in-module wiring can be made a branch point of the address system wiring, contributing to equalization of the wirings between address system chips. Since the branch point is close to an address receiving end of the memory chip, it is also useful for suppressing the signal reflective noise.

With respect to the arrangement of the plural data system bonding pads of the data processor chip, the arrangement of the data system bonding pads to which the memory chip connected by the data system wiring corresponds are made such that the chips are disposed in an alternating sequence. Therefore, it is not at all necessary to have the plural data system wirings cross. Therefore, it becomes possible to configure the in-module wirings of the data system in a single wiring layer alone of the module board, easily achieving the equalization of wiring lengths of the data system wiring.

As a specific form, the plural memory chips are stacked via a spacer (6), and the bonding pads of the lower memory chip are spaced from the upper memory chip. This is preferable for a stack structure of the memory chips wherein bonding pads are arranged along each of two parallel sides of the chips.

In the memory chip wherein bonding pads are arranged along each of the two parallel sides of the chip, by differentiating the side on which the data system bonding pads are arranged (14A) from the side on which the address system bonding pads are arranged (14B), it becomes possible to connect the data system wiring, whose timing margin is stricter than that of the address system, to the data processor chip via the shortest route. That is, the side along the data system bonding pads of the memory chip is allowed to oppose the side where the data system bonding pads of the data processor chip are arranged.

In this regard, it is preferred that the plural address system bonding pads of the data processor chip are arranged along a side next to the side having the data system bonding pads of the data processor chip, and that the address system substrate wiring of the module board is formed beside the data system substrate wiring of the module board.

As another specific form, when the memory chip has bonding pads along its one side, the plural memory chips (3B, 4B) may be provided such that the one sides are shifted in parallel relative to each other so as to expose the bonding pads of the lower memory chip.

[2] With respect to suppression of noise in the address system signal wiring, as another specific form, the address system wiring comprises: a substrate wiring formed on the module board; a bonding wire (WRpca) for connecting the bonding pads (BPpca) to which the data processor chip corresponds with the bonding lead (BLpca) to be connected to one end of the substrate wiring; and bonding wires (WRmca_A, WRmca_B) for commonly connecting bonding pads (Bpmca_A, Bpmca_b) to which a plurality of memory chips correspond with the bonding lead (BLmca) to be connected to the other end of the substrate wiring. Accordingly, the bonding lead (BLmca) being an extended end of the address system wiring becomes a branch point of the address system wiring, which contributes to equalization of the lengths of wirings between the address system chips. Since the branch point is close to the address receiving end of the memory chip, it is also useful for the suppression of the signal reflective noise.

[3] With respect to the suppression of noise in the data system signal wiring, as another specific form, the data system wiring comprises: substrate wirings (MLd1, MLd2)

formed on the module board; data system bonding leads (BLpd1, BLpd2) to be connected to one end of the substrate wiring; bonding wires (WRpd1, WRpd2) for connecting bonding pads (BPpdl, BPpd2) to which the data processor chip corresponds with the data system bonding lead on the one end; data system bonding leads (BLmd1, BLmd2) to be connected to the other end side of the substrate wiring; and bonding wires (WRmd1, WRmd2) for connecting bonding pads (BPmd_A), BPmd_B) to which the memory chip corresponds with the data system bonding leads on the other end side.

When the data system wirings comprise the data wiring and the data strobe signal wiring, it is preferred that the array of the data system bonding leads constituting the data wiring and the array of the data system bonding leads constituting the data strobe signal wiring are disposed as different bonding lead arrays. The above method can reduce the influence of crosstalk and coupling between the bonding wire for the data wiring and the bonding wire for the data strobe signal wiring. For instance, when the chip takes in data in synchronism with an edge change of the data strobe signal, the change in the output data of the chip becomes the high level or low level period of the data strobe signal. When there takes place a lot of crosstalk or capacitive coupling, such change in the output data causes the high level or low level of the data strobe signal to change sharply. Thus, the variation may accidentally be detected as an edge change of the data strobe signal.

Above the bonding wire (WR_DQS) constituting the data strobe signal wiring, the bonding wires (WR_VS) of the power supply/ground system are disposed. As a result, the bonding wires of the power supply/ground system with stable potential function as potential shielding wires with respect to the bonding wire for the data strobe signal wiring, which further improves the noise-resistance characteristic to the data strobe signals.

As another specific form, a wiring layer (L6) of the substrate wiring constituting the data strobe signal wiring and a wiring layer (L1) of the substrate wiring constituting the data wiring are provided as different layers. In this way, even inside the module board, the distance between the data strobe signal wiring and the data wiring can be longer.

For instance, the substrate wiring constituting the data strobe signal wiring extends from the wiring layer of the substrate wiring constituting the data wiring and is connected to a different wiring layer via a through hole. It is desirable that the above different wiring layer is the farthest one from the wiring layer of the substrate wiring.

[4] As another specific form, the module board has a signal wiring layer (L1) on its front side and a conductive layer (L6), in which solder ball electrodes are formed, on its back side. Further, the module board has an electrode wiring layer (L3) for electrolytic plating between the conductive layer in which the solder ball electrodes are formed and the signal wiring layer. The electrode wiring layer for electrolytic plating is useful for allowing the conductive layer in which the solder ball electrodes are formed and the signal wiring layer to be spaced from each other.

As still another specific form, the module board has a signal wiring layer (L1) on its front side and a conductive layer (L6), in which solder ball electrodes are formed, on its back side. Further, the module board has, directly under the signal wiring layer, a conductive layer (L2) in which a ground plane is formed. The module board further has conductive layers (L4, L5), in which a power supply plane is formed, directly above the conductive layer in which the solder ball electrodes are formed, and the module board further has an electrode wiring layer (L3) for electrolytic plating between the conductive layer in which the ground plane is formed and the conductive layer in which the power supply plane is formed. The electrode wiring layer for electrolytic plating is useful for allowing the conductive layer in which the solder ball electrodes are formed and the signal wiring layer to be spaced from each other. The ground plane eases the capacitive coupling between the signal wiring layer on the front side and the electrode wiring layer for electrolytic plating. The power supply plane eases capacitive coupling between the conductive layer in which the solder ball electrodes are formed and the electrode wiring layer for electrolytic plating.

[5] A semiconductor device according to another aspect has, on its module board, a plurality of memory chips in a stacked state and a data processor chip capable of simultaneously accessing the plural memory chips. A plurality of address system bonding pads related to an address and a command for the data processor chip to access the memory chips are connected, through a common address system wiring among said plural memory chips, to the address system bonding pads to which the memory chips correspond. The address system wiring comprises: a substrate wiring formed on the module board; a bonding wire which connects the bonding pads to which the data processor chip corresponds with the bonding lead connected to one end of the substrate wiring; and a bonding wire which commonly connects the bonding pads to which the memory chips correspond with the bonding lead to be connected to the other end of the substrate wiring.

A semiconductor device according to still another aspect has, on its module board, a plurality of memory chips in a stacked state and a data processor chip capable of simultaneously accessing the plural memory chips. A plurality of data system bonding pads related to data and a data strobe signal for the data processor chip to access the memory chips are connected, through individual address system wirings among the plural memory chips, to data system bonding pads to which the memory chips correspond. With respect to an arrangement of a plurality of data system bonding pads of the data processor chip, an arrangement of the data system bonding pads to which the memory chips connected by the data system wiring correspond is made such that the memory chips are disposed in an alternating sequence. The data system wirings comprise: a substrate wiring formed on the module board; a data system bonding lead connected to one end of the substrate wiring; a bonding wire which connects the bonding pads to which the data processor chip corresponds with the data system bonding lead on the one end side; a data system bonding lead to be connected to the other end side of the substrate wiring; and a bonding wire which connects the bonding pads to which the memory chips correspond with the data system bonding lead on the other end side.

The memory chip is a clock-synchronization type memory which performs a data-interface operation of a plurality of cycles a period of an external clock and further performs an internal-memory operation per cycle of the external clock.

2. Details of Embodiments Details of the embodiments will further be described.

<<Memory-access wiring path>> FIG. 1 illustrates a vertical cross-section of a semiconductor device according to the present invention. The semiconductor device 1 comprises: a data processor chip (SOC) 2; and stacked a plurality of memory chips (SDRAM_A, SDRAM_B) 3 and 4 which the data processor chip 2 simultaneously accesses on a module board (PCB) 5.

The data processor chip 2 may be a microcomputer or a chip for data processing equipped with a circuit module provided exclusively for specific data processing, such as image processing and communications-protocol processing. Namely, the chip is a so-called semiconductor integrated circuit chip of an SOC type. The data processor chip 2 has a memory interface and a memory controller for simultaneously accessing the memory chips 3 and 4. If the data processor chip is a microcomputer, it further comprises circuits such as a central processing unit, RAM, PROM, a bus state controller, an interruption controller, DMAC, a timer counter, an input/output port, etc.

Although not limited in particular, the memory chip 3 and 4 are MOBILE-DDRB or DDR2-SDRAMs whose number of bits for parallel-data input/output is 32. With regard to DDR2-SDRAM, its interface function etc. are described, for instance, in the JEDEC standard (JESD79). Also, the terminal arrangement specified in the JEDEC standard is the one for a package, and a terminal arrangement for chips is not specified there. Though not particularly shown, MOBILE-DDR or DDR2-SDRAM is a clock-synchronization type memory which performs a data-interface operation with an external device in synchronism with two edges of the rise and fall of an external clock and which performs an internal memory operation per cycle of the external clock. As interface terminals, it has a data input/output terminal, a data strobe terminal, an address input terminal, a clock input terminal, etc. The memory chips 3 and 4 have, as external terminals of the chips, bonding pads which are arranged along their two opposing sides, respectively. There is provided a spacer (SPC) 6 between the memory chip 3 and the memory chip 4, and the bonding pads of the lower memory chip 3 are arranged to be exposed so that they can be bonded.

The module board 5 has a plurality of conductive layers. A signal wiring is formed on the front side on which the chips 2, 3, 4 are mounted. On the back side, as external terminals of the semiconductor device 1, there are formed numbers of solder ball electrodes (BAL) 7 constituting a BGA (Ball Grid Array). Reference numeral 8 typically shows a substrate wiring formed on the front side layer of the module board 5. Reference numeral 9 typically shows a bonding wire which connects bonding pads of the chips with bonding leads of the substrate wiring. The chips 2, 3, 4 and the bonding wires 9 are protected by being sealed with resin (RSN) 10.

Figure 2:
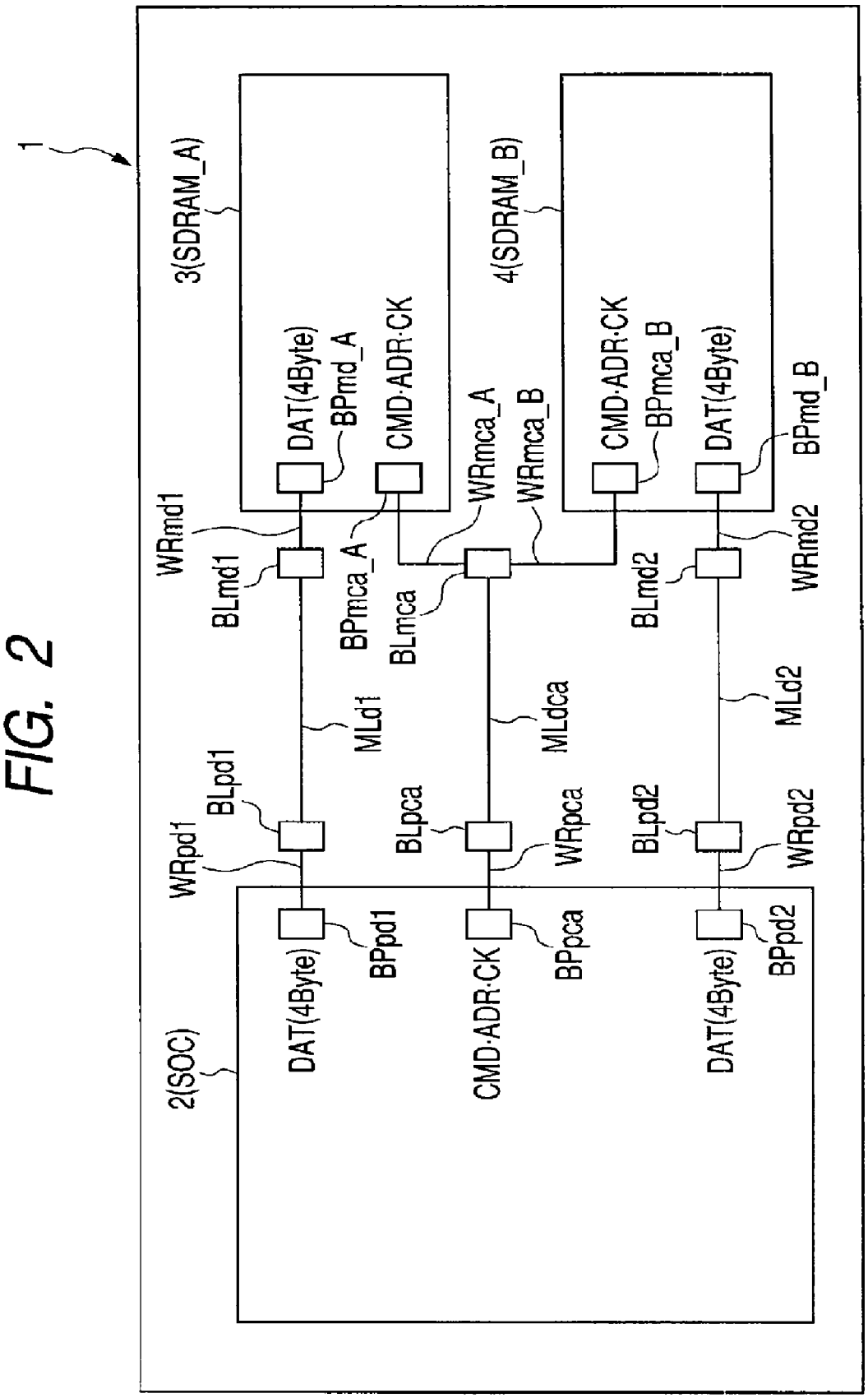
FIG. 2 is a diagram showing a wiring topology for a memory access of the semiconductor device of FIG. 1.

FIG. 2 shows a wiring topology for a memory access of the semiconductor device 1. BPmd_A shows one of the data system bonding pads used for input and output of 4-byte data DAT (4 byte) of the memory chip 3. BPmca_A shows one of the address/command system bonding pads used for an input interface of a command, address, clock CMD-ADR-CK of the memory chip 3. Similarly, there are illustrated in the memory chip 4 a data system bonding pad BPmd_B and an address/command system bonding pad BPmca_B. Similarly, in the data processor chip 2, there are illustrated a data system bonding pad BPpd 1 representing one (1) bit of 4-byte data DAT (4 byte), a data system bonding pad BPpd 2 representing one (1) bit of 4-byte data DAT (4 byte) of the rest, and an address/command system bonding pad BPpca used for an output interface of the command, address, and clock CMD-ADR-CK. MLd1, MLd2, and MLca typically show the substrate wirings formed on the module board.

BLpd1 and BLmd1 are bonding leads formed at both ends of the data system substrate wiring MLd1, and BLpd2 and BLmd2 are bonding leads formed at both ends of the data system substrate wiring MLd2. The data system bonding pads of the data processor chip 2 correspond to the data system bonding pads of the memory chips 3, 4 in a one-to-one relationship. For instance, when the bonding pads BPpd1 and BPpd2 correspond to the bonding pads BPmd_A and BPmd_B of the memory chip 3, BPpd1 is connected to BLpd1 by a bonding wire WRpdl, and BPmd_A is connected to Blmd1 by the bonding wire WRmdl. Similarly, BPpd2 is connected to BLpd2 by the bonding wire WRpd2, and BPmd_B is connected to BLmd2 by the bonding wire WRmd2. Though other data system paths are not shown, similarly, the data system bonding pads of the data processor chip 2 for a memory access are connected, between the memory chips 2 and 3, to the data system bonding pads to which memory chips 3 and 4 correspond through individual data system wiring paths.

Figure 4:
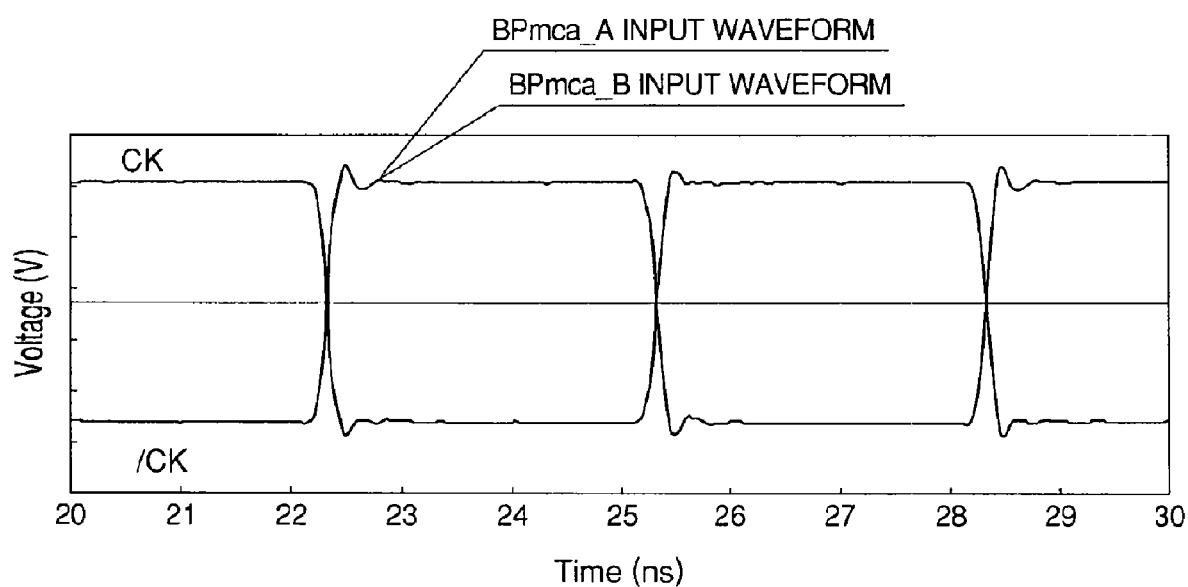
FIG. 4 is a waveform chart illustrating input waveforms of differential clocks CK and /CK inputted to respective memory chips.

<<Equalization of address system wirings and noise reduction>> In FIG. 2, BLpca and BLmca are bonding leads formed at both ends of the address system substrate wiring MLca. The address/command system bonding pads of the data processor chip 2 are connected to the address system bonding pads to which the memory chips 3 and 4 correspond through the address system wiring shared by the memory chips 3 and 4. For instance, when the bonding pad BPpca corresponds to bonding pads BPmca_A and BPmca_B of the memory chips 3 and 4, BPpca is connected to BLpca by the bonding wire WRpca. Further, BPmca_A and BPmca_B are commonly connected to BLmca by the bonding wires WRmca_A and WRmca_B. As a result, two memory chips 3 and 4 each being capable of 32-bit parallel output are simultaneously operated to make the parallel-input/output of the 64-bit data possible. Also, the memory chips 3 and 4 are, as shown in FIG. 2, stacked. Therefore, the address system terminals having mutually the same function between the memory chips 3 and 4 are spaced vertically and are approximately at the same position. As a result, it becomes easy to allow the address system substrate wiring MLca to be connected to the corresponding address system bonding pad BPpca of the data processor chip 2 to extend to the vicinity of the address system bonding pads BPmca_A and BPmca_B which correspond to each other between the memory chips 3 and 4. The bonding lead BLmca being the extended end of the substrate wiring MLca can be made as a branch point of the address system wiring, which contributes to equalization of the wirings between address system chips. Since the branch point is close to the receiving ends BPmca_A and BPmca_B of the address system signals of the memory chips 3 and 4, the suppression of the signal reflective noise can also be achieved. As examples of the address system signal waveform in the bonding pads BPmca_A and BPmca_B of both the memory chips 3 and 4, waveforms of the differential clocks CK and /CK are shown in FIG. 4. As described above, by the equalization of the address system signal wirings and suppression of the signal reflection, the clock waveforms are generally identical between the memory chips 3 and 4. In FIG. 4, the two waveforms are overlapped in the front and back direction of the sheet and are shown with substantially no difference.

Figure 3:
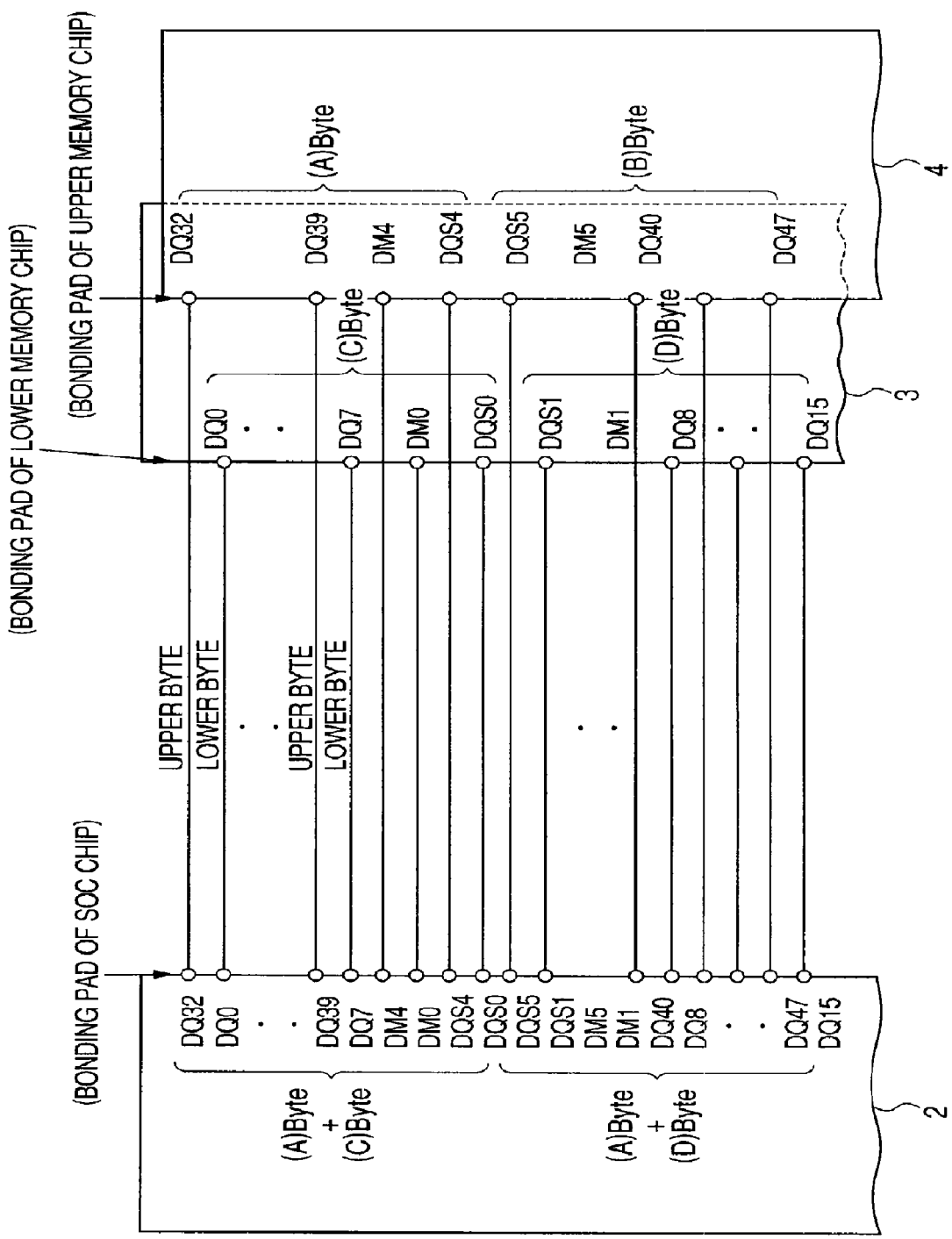
FIG. 3 is a diagram illustrating data system wirings being connected when memory chips are stacked.

<<Equalization of data system wirings>> FIG. 3 illustrates the data system wirings being connected when the memory chips are stacked. In this regard, the data system terminals interfaced between the data processor chip 2 and the memory chips 3, 4 are data-input/output terminals DQ0 through DQ63 of 8 bytes, data strobe terminals DQS0-DQS7 by unit of byte/data and data mask terminals DM0-DM7 by unit of byte data. In the memory chips 3, 4, the data strobe terminals and the data mask terminals are disposed close to the corresponding data input/output terminals. In FIG. 3, in the memory chip 3, there are arranged typically-illustrated data system terminals ((C) Byte) by one (1) byte of DQ0-DQ7, DM0, DQS0, and the data system terminals ((D) Byte) by one (1) byte of DQ8-DQ15, DM1, and DQS1 are arranged in sequence. Similarly, in the memory chip 4, there are arranged typically-illustrated data system terminals ((A) Byte) by one (1) byte of DQ32-DQ39, DM4, DQS4, and the data system terminals ((B) Byte) by one (1) byte of DQ40-DQ47, DM5, and DQS5 are arranged in sequence. On the contrary, the terminal arrays of the data processor chip 2 are arranged, considering the stacked state of the memory chips, so that the corresponding terminals of the memory chip 3 and the corresponding terminals of the memory chip 4 may appear by turns. As a result, the data system wirings do not cross in midstream. Like in the memory chip, when the same arrays of the byte unit as (A) Byte, (B) Byte, (C) Byte, and (D) Byte are adopted for the terminal arrays of the data processor chip 2, the data system wirings cannot help crossing in midstream. That is, the wiring layers of the data system substrate wirings represented by MLd1 and MLd2 in FIG. 2 have to be diverted to another layer on the way via a through hole to prevent the electric leak. With such a method of wiring inside the module board, equalization of data system wirings is difficult. As illustrated in FIG. 3, if there is no crossing portion in the data system wirings, it is possible to form all of them in the same wiring layer of the module board, making it easy to equalize the data system wirings.

Figure 5:
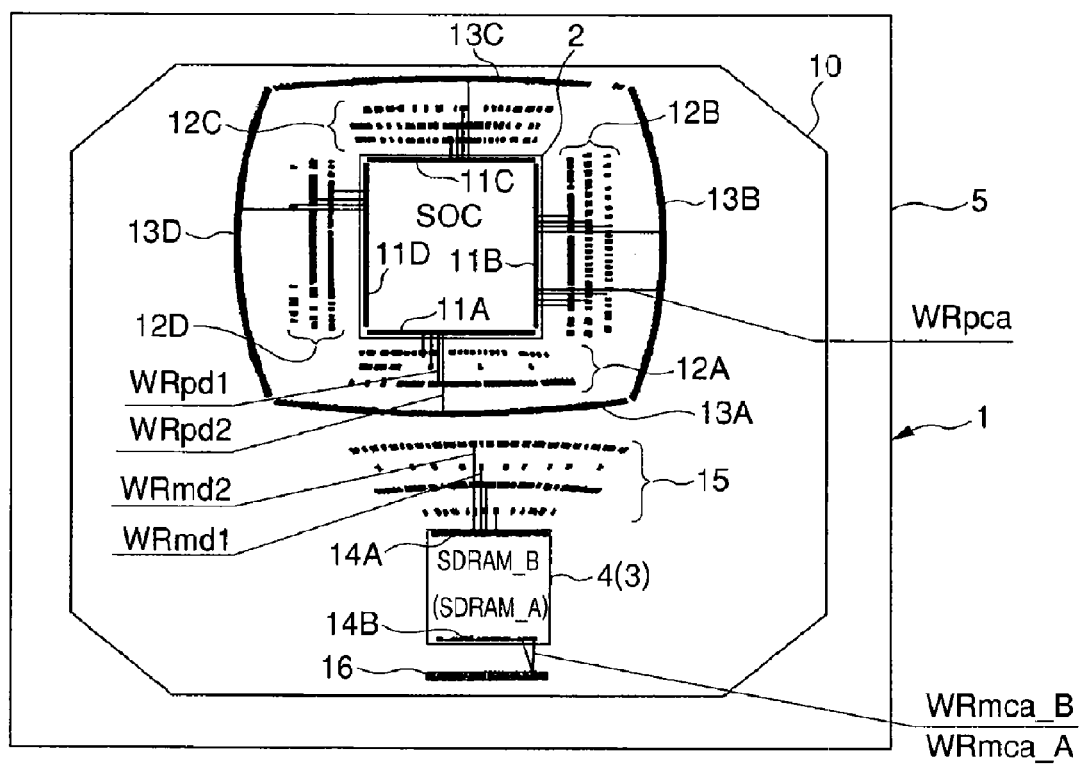
FIG. 5 is a plan view showing a plane layout configuration of the semiconductor device of FIG. 1 and the state of connection using bonding wires.
Figure 6:
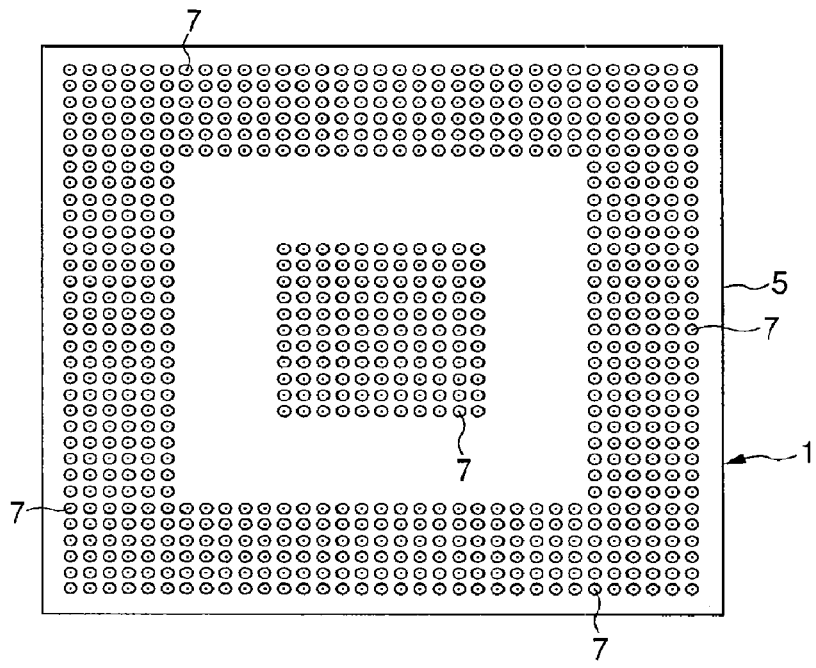
FIG. 6 is a view illustrating an arrangement of solder ball electrodes as seen from the back side of the semiconductor device of FIG. 5.
Figure 7:
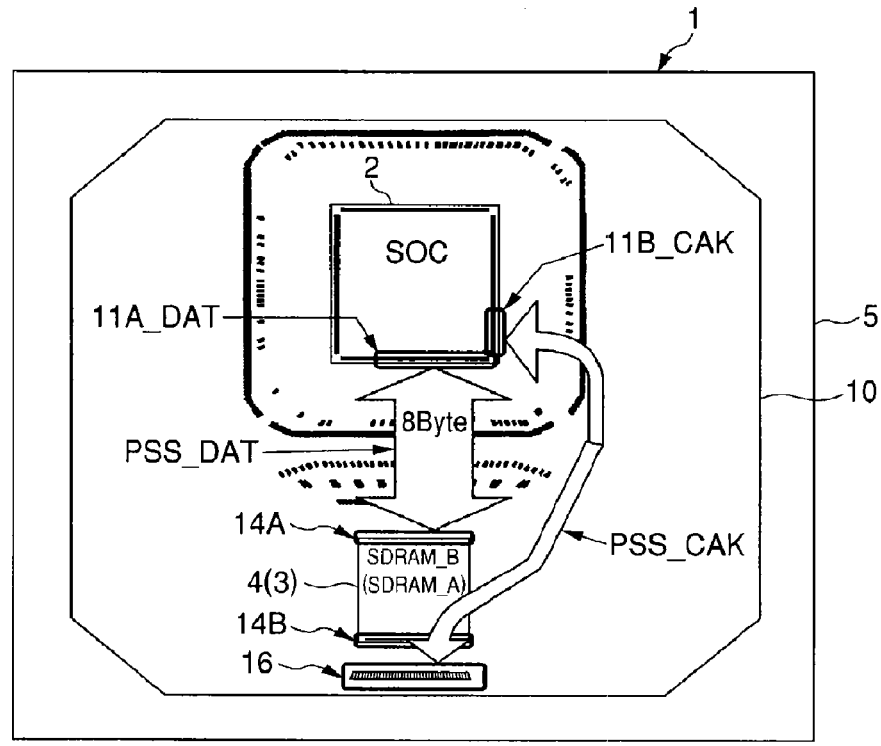
FIG. 7 is a plan view showing a plane layout configuration of the semiconductor device of FIG. 5 and wiring paths as a whole for a memory access.

FIG. 5 illustrates a layout of the semiconductor device 1 in a plan view and the state of connection using bonding wires. FIG. 6 illustrates an arrangement of solder ball electrodes of the semiconductor device 1 of FIG. 5 as seen from the back side. FIG. 7 shows a layout of the semiconductor device 1 in a plan view and wiring paths as a whole for the memory access.

In FIG. 5, 11A-11D indicate bonding pad arrays of the data processor chip 2, and 12A-12D and 13A-13D indicate a plurality of bonding lead arrays corresponding to the bonding pad arrays 11A-11D. The bonding pad array 11A includes the bonding pads BPpd1 and BPpd2 of FIG. 2 and the bonding pad array 11B includes the bonding pad BPpca of FIG. 2. The bonding lead arrays 12A and 13A include the bonding leads BLpd1 and BLpd2 of FIG. 2. Further, the bonding lead arrays 12B and 13B include the bonding lead BLpca of FIG. 2.

14A and 14B indicate the bonding pad arrays of the memory chip 4 (3), and are arranged along two parallel sides of the chip. Reference numeral 15 indicates four arrays of the bonding leads corresponding to the bonding pad array 14A, and reference numeral 16 indicates a bonding lead array corresponding to the bonding pad array 14B. The bonding pad array 14A is assigned to the interface of the data system signals such as data and data strobe signals, and includes the bonding pads BPmd_A and BPmd_B shown in FIG. 2. The bonding pad array 14B is assigned to the interface of the address system signals of the command address clock, and includes bonding pads BPmca_A and BPmca_B shown in FIG. 2. The bonding lead arrays 15 include the bonding leads BLmd1 and BLmd2 shown in FIG. 2, and the bonding lead array 16 includes the bonding lead BLmca shown in FIG. 2.

FIG. 5 illustrates, between the bonding pads and the corresponding bonding leads, the bonding wires WRpd1, WRpd2, WRmd1, WRmd2, WRpca, WRmca_A, and WRmca_B shown in FIG. 2.

In FIG. 7, 11A_DAT and 11B_ACK indicate bonding pad arrays for the memory interface assigned to the access of the memory chips 4 and 3. In particular, the bonding pad array 11A_DAT is assigned to the interface of data system signals such as data and data strobe signals, and the bonding pad array 11A_CAK arranged on the adjoining side is assigned to the interface of the address system signals of the command address clock. The data system bonding pad array 14A of the memory chips 3 and 4 is so disposed as to face the data system bonding pad 11A_DAT of the data processor chip. Thus, by differentiating the side of the chip 2 along which the data system bonding pad array 11A_DAT is arranged and the side of the chip 2 along which the address system bonding pad array 11B_CAK is arranged, it becomes possible to separate the address system wiring path PASS_ACK and the data system wiring path PSS_DAT. Also, the data system bonding pad array 14A of the memory chips 3 and 4 is so disposed as to face the data system bonding pad 11A_DAT of the data processor chip. Therefore, the data system wiring which is stricter in timing margin as compared with the address system can be connected to the data processor chip through the shortest route, which contributes to the equalization of the data system wiring. The address system substrate wiring of the module board 5 is formed beside the data system substrate wiring of the module board 5.

Figure 8:
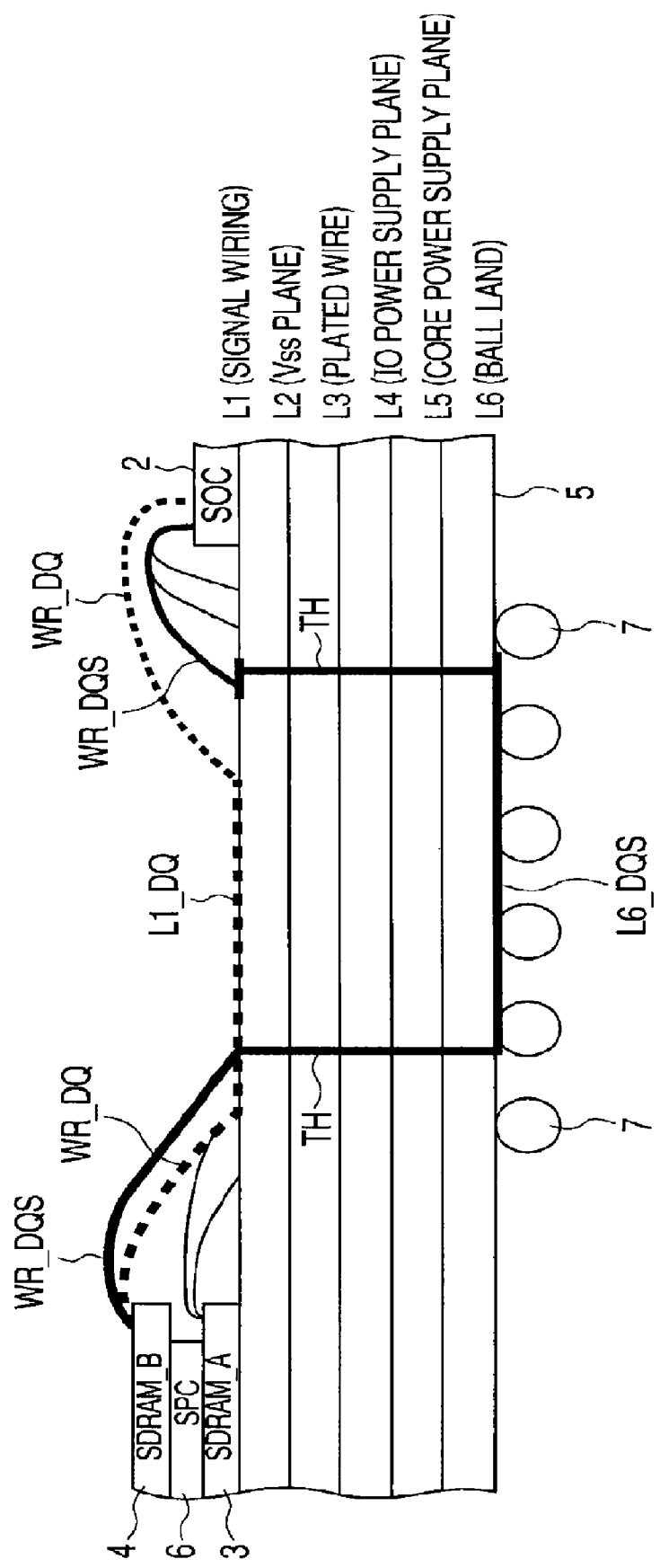
FIG. 8 is a vertical cross-sectional view illustrating wirings of a data system of the semiconductor device.
Figure 9:
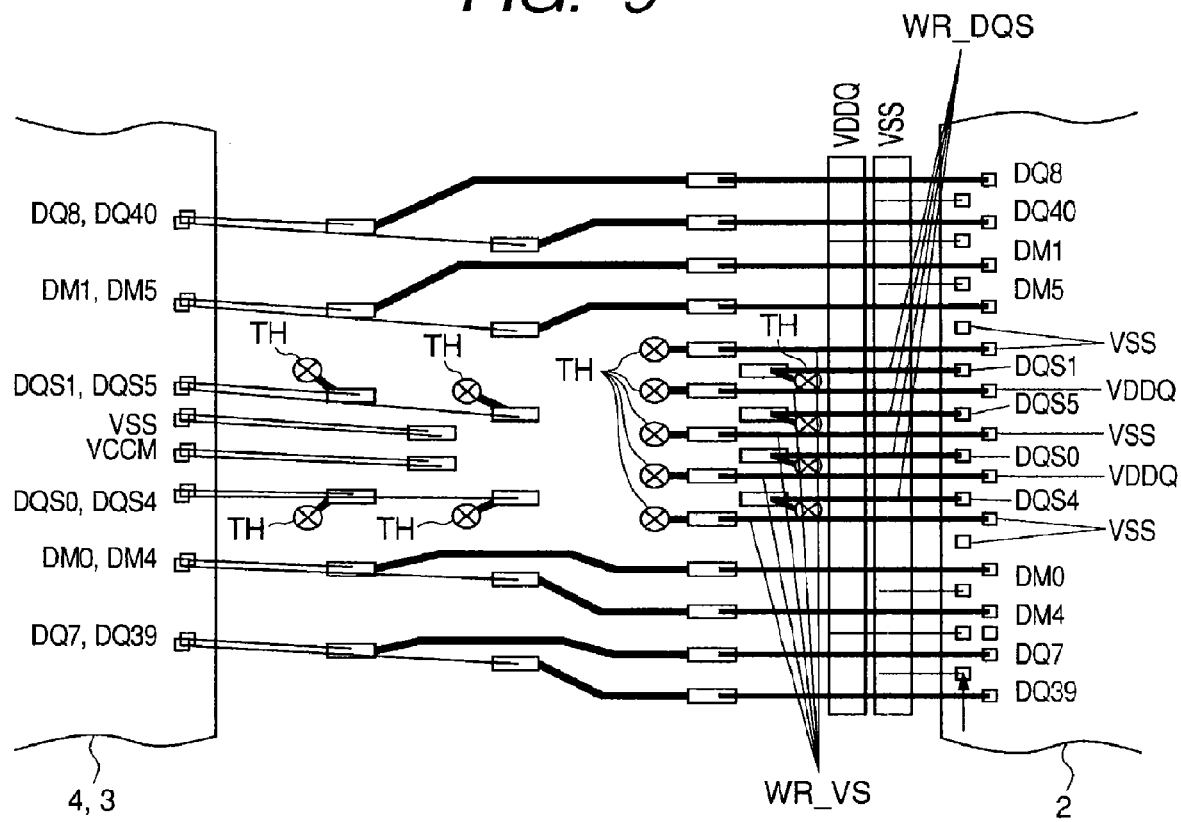
FIG. 9 is a plan view illustrating the data system wiring paths corresponding to FIG. 8.

<<Noise reduction in data system signal wirings>> FIG. 8 is a vertical cross-sectional view illustrating a data system wiring system of the semiconductor device 1, and FIG. 9 illustrates a planar configuration of the data system wiring path corresponding to FIG. 8.

As shown in FIG. 8, though not particularly limited, the module board 5 has six conductive layers L1-L6. L1 indicates a conductive layer forming a signal wiring, and L2 indicates a conductive layer where a ground plane to which a ground potential Vss is given is formed. L3 indicates a conductive layer where there is formed a plated wire, which allows various conductive patterns to be connected to one electrode for electrolytic plating. L4 indicates a conductive layer where an IO power supply plane to which an IO power supply etc. for the external interface of the chips 2, 3, and 4 are given is formed, L5 indicates a conductive layer where there is formed a core power supply plane to which a core power supply with respect to the logical circuits of the chips 2, 3, and 4 is given, and L6 is a conductive layer where solder ball electrodes 7 etc. are formed. The connection between the conductive layers is made via a typically-illustrated through hole TH.

As shown by a broken line in FIG. 8, the data wiring in the data system wiring passes through the substrate wiring L1_DQ of the layer L1 connected to the bonding wire WR_DQ. As shown by a solid line of FIG. 8, the data strobe signal wiring in the data system wiring passes the substrate wiring L6_DQS of the layer L6 from the layer wiring L1 connected to the bonding wire WR_DQS via the through hole TH. L1 and L6 are the wiring layers farthest apart. Between them, there are provided the ground plane and power supply plane with stable potential serving as potential shields, which makes it possible to reduce the mutual influence of crosstalk noise and capacitive coupling noise between the substrate wiring L1_DQ and the substrate wiring L6_DQS.

As shown in FIG. 9, an array pitch of the bonding pads of the data processor chip 2 is smaller than that of the memory chips 3 and 4. The reason is that, for the data processor chip 2, the memory interface function to the memory chips 3 and 4 is simply one peripheral function and that there have to be disposed numbers of external terminals for other various signal interface functions necessary for data processing. In FIG. 9, the bonding pads of the upper memory chip 4 and the bonding pads of the lower memory chip 3 are slightly shifted as seen in a plan view for the sake of illustration. The bonding pads of the data processor chip 2 are disposed along each side in two rows in a staggered configuration. Identifiers of the data system terminals described based on FIG. 3 are given to the bonding pads in FIG. 9.

As shown in FIG. 9, the data system bonding pads in the data processor chip 2 are arranged in the direction of marginal sides of the chip 2. However, they are disposed as a group for each type and not mixed at random with data terminals such as DQ8 and DQ40, the data mask terminals such as DM1, and the data strobe terminals such as DQS1 and DQS5. The bonding pads of the data terminals represented by DQ8 and DQ40 and the data mask signal terminals represented by DM1 and DM5 are disposed in a second row from the marginal side of the chip 2. Further, the bonding pads of the data strobe terminals represented by DQS1, DQS5, DQS0, and DQS4 are disposed in a first row from the marginal side of the chip 2. The data mask signals interfaced through the data mask terminal are selective mask signals of the write data. Therefore, they are the signals which indicates the propriety of the data masks on the basis of the rising and falling timing of the data strobe signals in a write operation. That is, for the data strobe signals, the data mask signals are changed at the same timing as the data signal. Thus, the data mask signal is, like the data signal, regarded as a noise source to the data strobe signal. From this viewpoint, the data mask signal terminal is treated like the data terminal.

As described above, the data strobe terminals and the data terminals are not intermingled. Also, the corresponding bonding pad arrays are disposed by turns in the front and back direction. Therefore, the influence of crosstalk and coupling between the bonding wire for the data wiring and the bonding wire for the data strobe signal wiring can be reduced.

Figure 11:
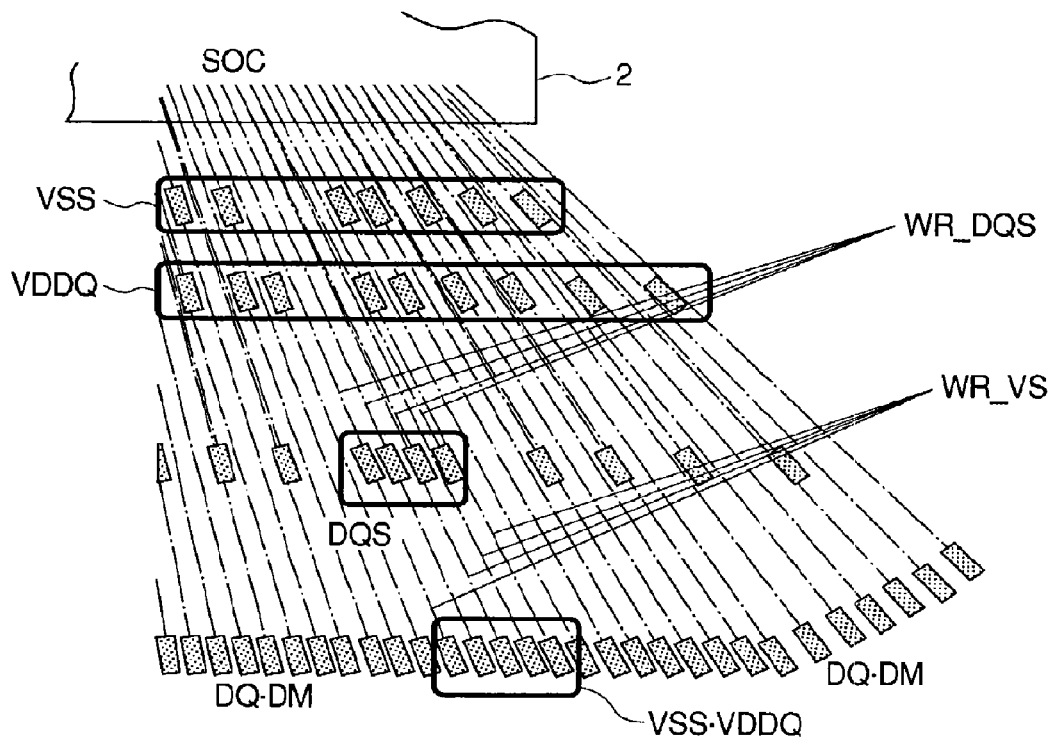
FIG. 11 is a plan view illustrating bonding wires WR_DQS constituting the data strobe signal wiring and bonding wires WR_VS of the power supply/ground system being connected and overlapped in a substantially practical state.

Further, in the second row corresponding to the position of the bonding pads of the data strobe terminal represented by DQS1, DQS5, DQS0, and DQS4 disposed in the first row close to the marginal side of the chip 2, there are disposed bonding pads of a power supply terminal VDDQ and a ground terminal VSS for receiving a power supply or a ground potential. Accordingly, above the bonding wire WR_DQS for connecting the data terminals DQS1, DQS5, DQS0, and DQS4 of FIG. 9 with the corresponding bonding leads, there are located the bonding wires WR_VS for connecting the power supply terminal VDDQ and the ground terminal VSS with the corresponding bonding leads. Since the bonding wire for connecting the pads which are away from each other is formed in the shape of a big loop and the bonding wire for connecting the pads which are close to each other is formed in the shape of a small loop, the contact between the wires is prevented. By disposing the bonding wires WR_VS of the power supply/ground system above the bonding wires WR_DQS constituting the data strobe signal wiring, the bonding wires WR_VS of the power supply/ground system with stable potential function as potential shielding wires against the bonding wires WR_DQS for the data strobe signal wiring. Therefore, the noise-resistance characteristic for the data strobe signal is further improved. FIG. 11 illustrates the bonding wires WR_DQS constituting the data strobe signal wiring and the bonding wires WR_VS of the power supply/ground system being connected and overlapped in a substantially practical state.

Figure 10:
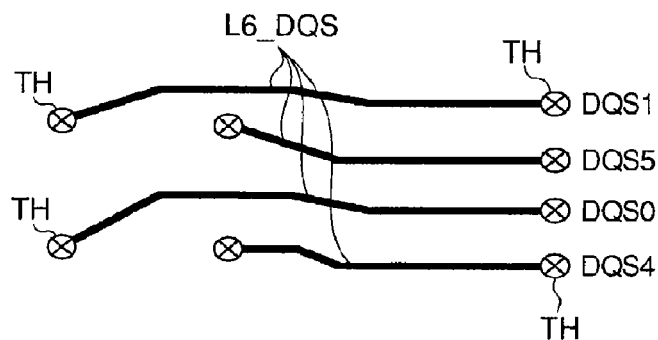
FIG. 10 is a plan view showing a pattern of the substrate wirings in the conductive layer L6 corresponding to data strobe signals of FIG. 9.

FIG. 10 illustrates a pattern of the substrate wirings L6_DQS of the conductive layer L6 corresponding to the data strobe signals DQS1, DQS5, DQS0, and DQS4 of FIG. 9.

Figure 12:
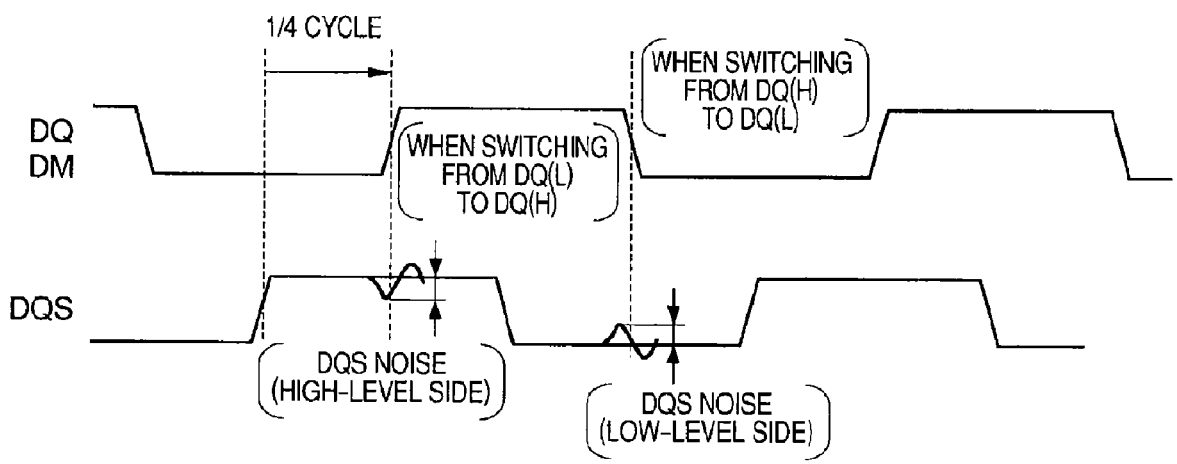
FIG. 12 is a waveform chart illustrating how the level of the data strobe signal changes at unexpected positions according to the change in data.

As shown in FIG. 12, in synchronism with the edge variation of the data strobe signal DQS, the memory chips 3 and 4 take in data in a write operation. In this regard, the outputted variation of the data DQ (data mask signal DM) is a high-level or low-level period of the data strobe signal DQS. When there takes place a lot of crosstalk or capacitive coupling, if the high level or low level of the data strobe signal DQS is sharply changed by such variation of the output data DQ, the change may accidentally be detected as an edge variation of the data strobe signal DQS. When the unwanted voltage drop on the high-level side of DQS due to noise is below the minimum voltage (ViHmin) of the logical threshold voltage of the high level, it is detected as an edge variation of the data strobe signal DQS. If the unwanted voltage rise due to noise on the low level side of DQS exceeds the maximum voltage (ViLmax) of the logical threshold voltage of the low level, it is detected as an edge variation of the data strobe signal DQS.

Figure 13:
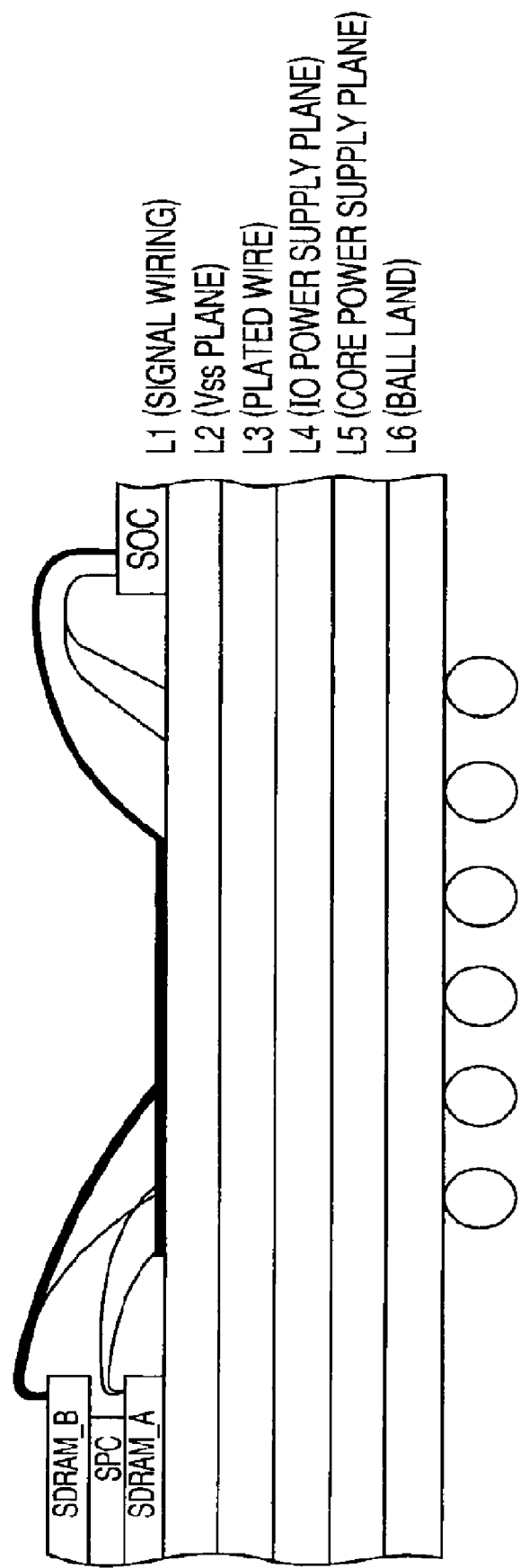
FIG. 13 is a vertical cross-sectional view showing an example for comparison with the example of FIG. 8.
Figure 14:
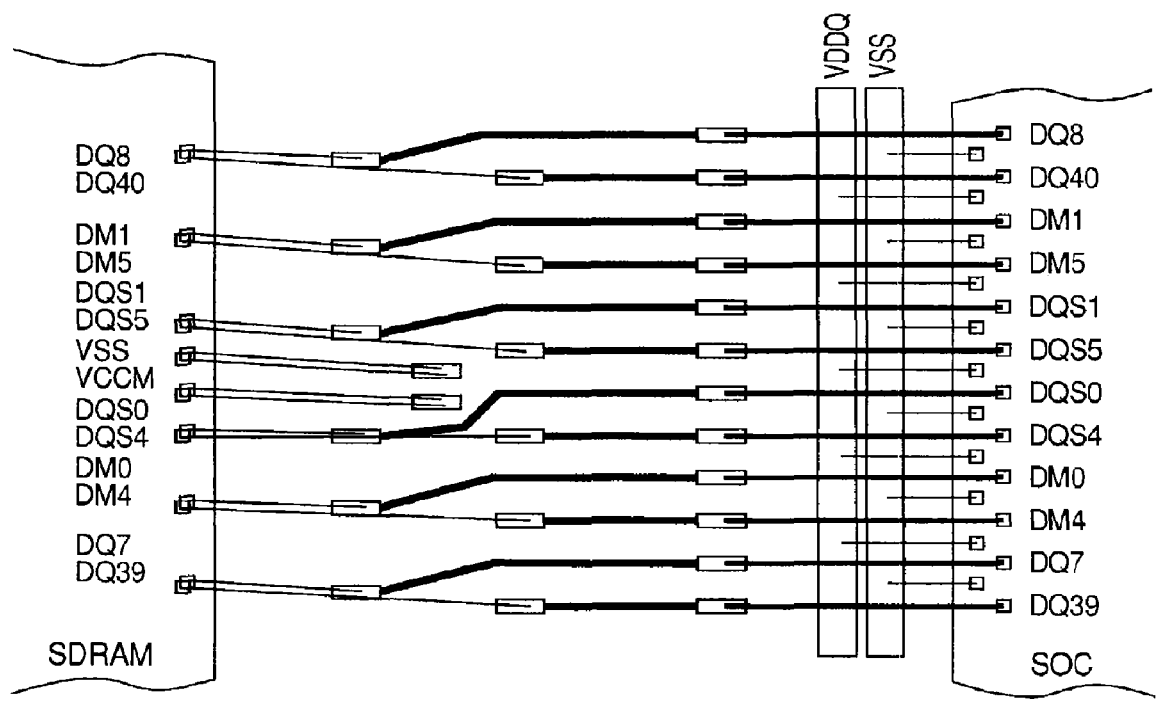
FIG. 14 is a plan view showing an example for comparison with the example of FIG. 9.

As described based on FIGS. 8 and 9, the noise-resistance characteristic for the data strobe signal DQS with respect to changes in the data DQ or the data mask signal DM is improved. Therefore, the noise level shown in FIG. 12 is kept low and malfunction due to improper detection of data is prevented. On the other hand, as in FIGS. 13 and 14 showing comparative examples, in the case where the substrate wiring of the data and strobe signals is formed in the conductive layer L1 alone and the bonding pads of the data and strobe signals are disposed in the same row of the data processor chip (SOC), the effect of the noise-resistance characteristic against the above data strobe signals cannot be obtained, which may cause malfunction.

Figure 15:
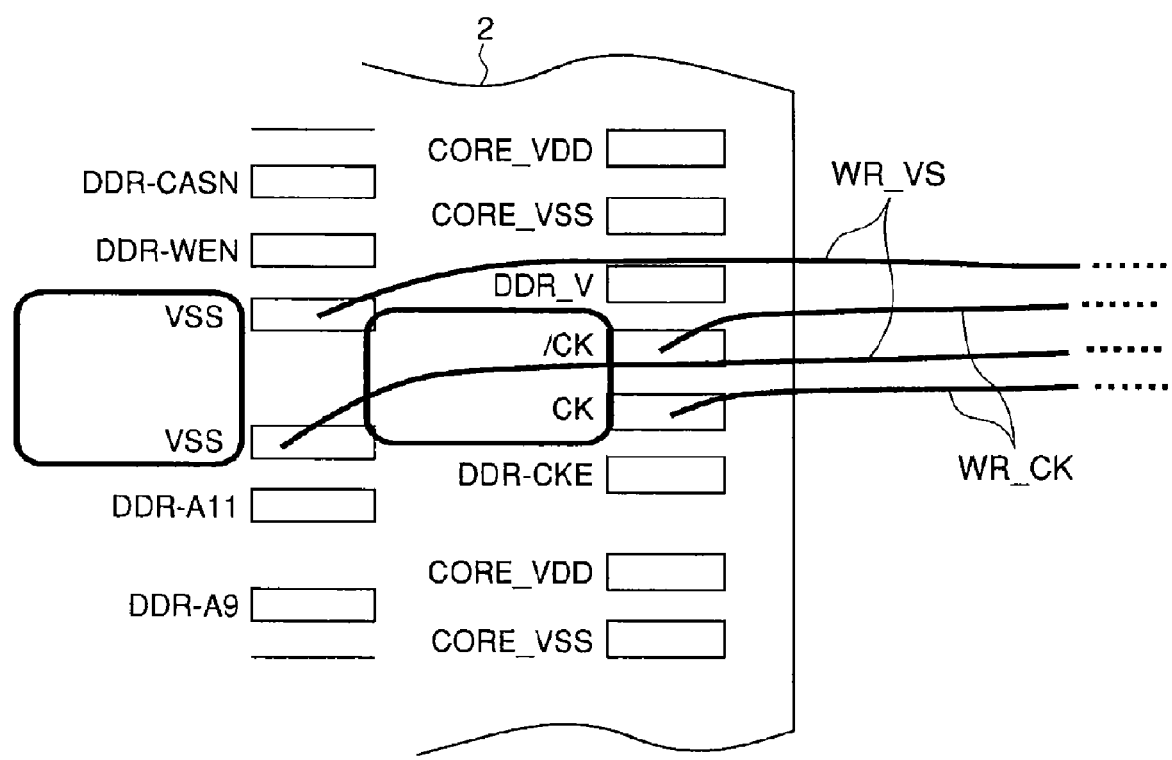
FIG. 15 is a plan view diagrammatically showing a configuration wherein a noise-resistance characteristic to differential clock signals is improved.

FIG. 15 illustrates a structure for improving the noise-resistance characteristic to a differential clock signal. The structure shown in FIG. 15 is the one in which the principle explained in FIGS. 8 and 9 is applied to the differential clock wiring. That is, the bonding pads of the differential clock signal terminals CK and /CK supplied from the data processor chip 2 to the memory chips 3 and 4 are disposed along a first bonding pad array near the marginal side of the chip 2. Further, along a second bonding pad array behind it, bonding pads corresponding to the power supply or ground terminal, for instance, ground pads of the ground terminals VSS, are disposed. Above the bonding wires WR_CK which connect the bonding pads of the differential clock signal terminals CK, /CK and the corresponding bonding leads, there are disposed the bonding wires WR_VS which connect the bonding pads of the ground terminals VSS and the corresponding bonding leads, which improves the noise-resistance characteristic of the differential clock signal.

Figure 16:
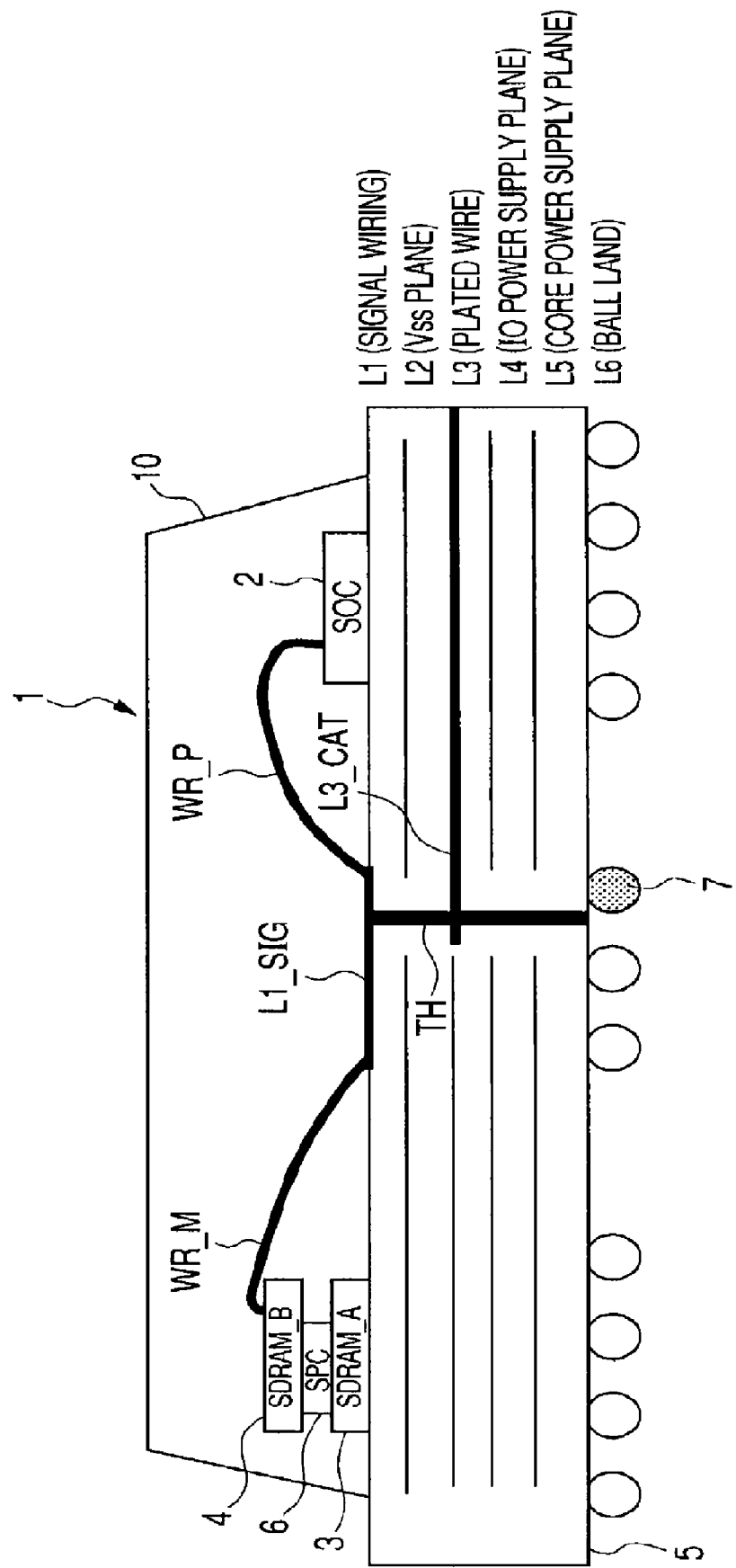
FIG. 16 is a vertical cross-sectional view illustrating how a plated wire of a conductive layer L3 and a signal wire are connected.

FIG. 16 illustrates how a plated wire and a signal wire in the conductive layer L3 are connected. L1_SIG collectively indicate signal wirings formed in the conductive layer L1, and WR_M collectively indicate bonding wires which connect the bonding pads of the memory chips 3 and 4, and the bonding leads disposed on one end portion of the signal wiring L1_SIG. Further, WR_P collectively indicates the bonding wires which connect the bonding pads of the data processor chip 2 with the bonding leads disposed at the other end portion of the signal wiring L1_SIG. The plated wire L3_CAT in the conductive layer L3 is connected, via a prescribed through hole TH, to the signal wiring L1_SIG. In an assembling process, the plated wire L3_CAT is cut off at the peripheral end of the module board 5. Before the assembly, all the plated wires are electrically conducted and are used for one electrode of the electrolytic plating. The electrical potential of the plated wire is varied according to the electric potential of the signal wire connected inside the module board 5. Between the plated wire L3_CAT and the signal wiring of L1, there is provided a ground plane of L2 with stable electric potential. Further, between the plated wire L3_CAT and the ball land of L6 or the signal wiring, there are provided power supply planes of L4 and L5 with stable electric potential, which prevents the influence of crosstalk of the signal wirings caused by the change in the electric potential of the plated wire L3_CAT and noise due to unwanted capacitive coupling. In this connection, in order to make the signal wiring between different conductive layers longer, it is better, in a sense that the signal wiring and the ball land are formed in the layer L1 on the front side and the layer L6 on the back side and that the reference of the signal wire in each of the layers L1 and L6 is stably defined, to provide the ground plane or the power supply plane next to L1 and L6. In this regard, it can be said that, in terms of improving the noise-resistance characteristic of the signal wirings in the front and back conductive layers, it is the best mode of arrangement to have the plated wire sandwiched with conductive layers having stable electric potential such as the power supply plane and the ground plane.

Figure 17:
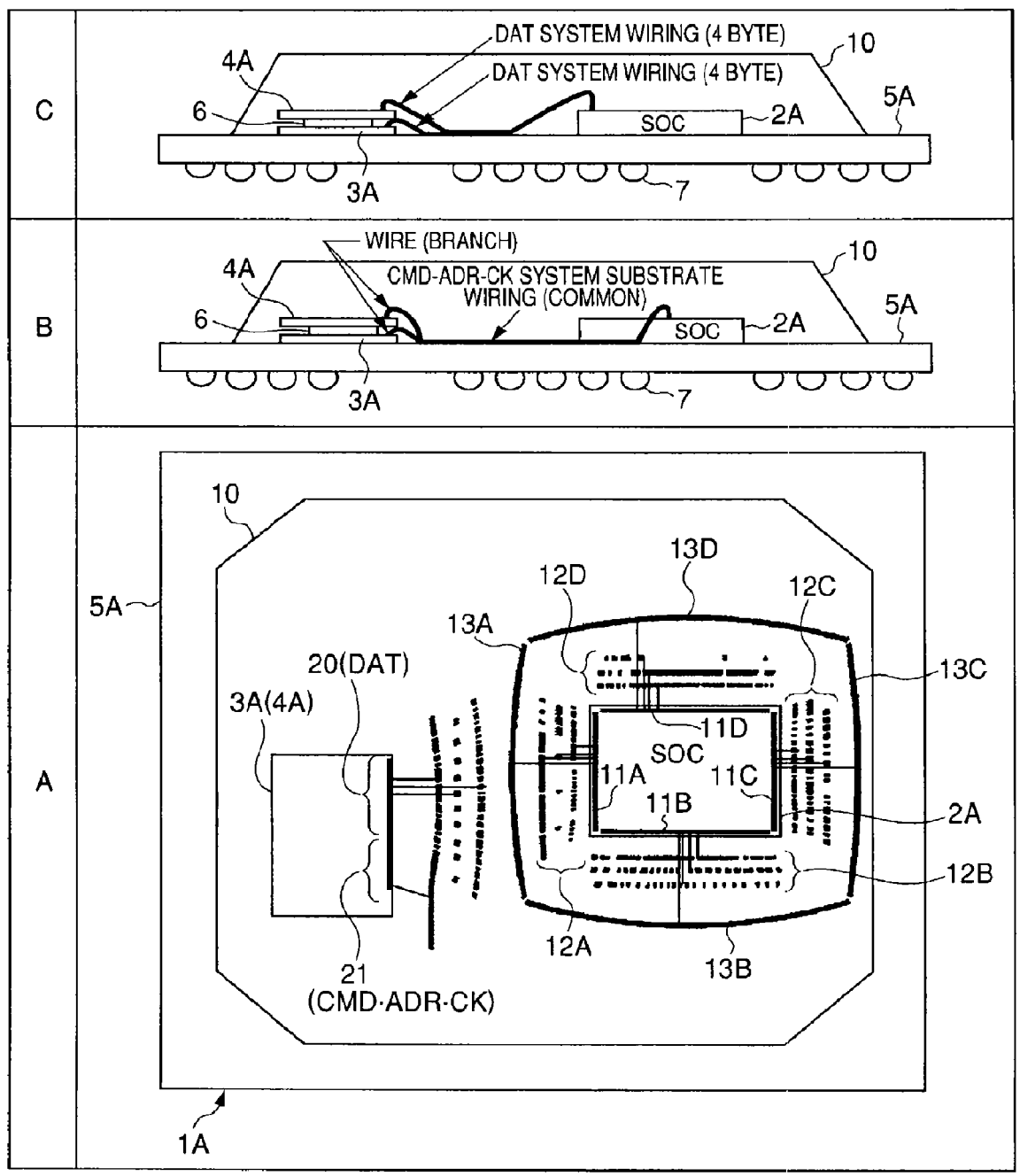
FIG. 17 is a diagram showing another example of the semiconductor device wherein memory chips each having pads on one side are stacked using a spacer.

FIG. 17 shows another example of the semiconductor device. Reference character A indicates a plan view, reference character B indicates a front view, and reference character C indicates a front cross-sectional view along a line passing through the vicinity of an area where the data system bonding pads are arranged. The semiconductor device 1A shown in FIG. 17 differs from the one previously described in that memory chips 3A and 4A with pads on one side are used. Such memory chips 3A and 4A have bonding pads arranged on one of the long sides alone. The area 20 where the data system (DAT) bonding pads are arranged and the area 21 where the command address clock system (CMD-ADR-CK) bonding pads are arranged are separated. The area 20 where the data system bonding pads are arranged are, as previously described, opposed to the bonding pad array 11A of the data and strobe signal system of the data processor chip 2A, making it easier to equalize the data wirings and shorten the path lengths. As compared with the case shown in FIG. 5, it is possible to somewhat shorten the wire lengths of the command address clock system. Since other structures are the same as those of the semiconductor device 1, the detailed description thereof is omitted.

Figure 18:
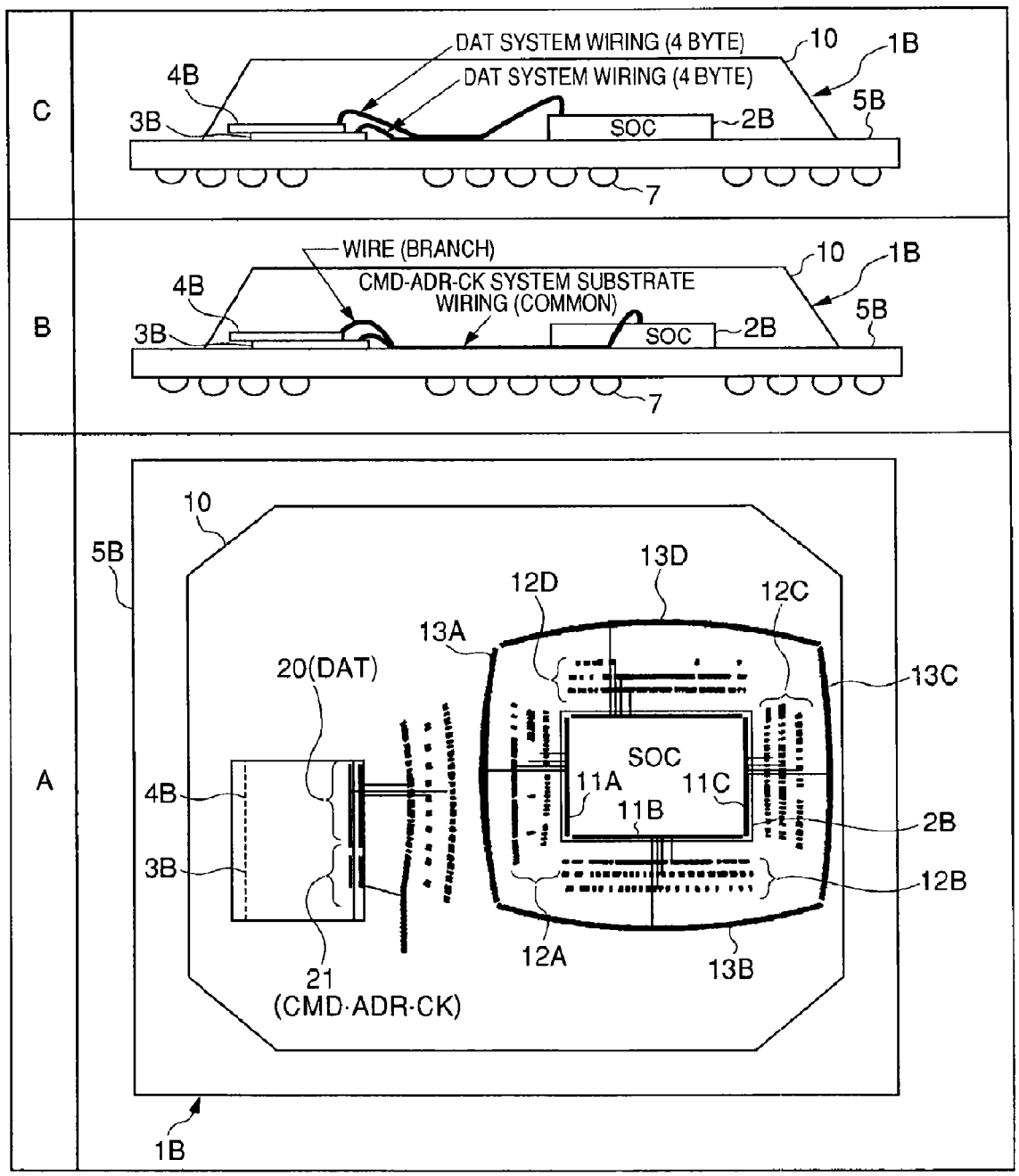
FIG. 18 is a diagram showing still another example of the semiconductor device wherein memory chips each having pads on one side are stacked without using a spacer.

FIG. 18 shows still another example of the semiconductor device. Reference character A indicates a plan view, reference character B indicates a front view, and reference character C indicates a front cross-sectional view along a line passing through the vicinity of an area where the data system bonding pads are arranged. The semiconductor device 1B shown in FIG. 18 differs from the one previously described in that memory chips 3B and 4B with pads on one side are shifted and stacked without using a spacer. Bonding pads are arranged on one of the long sides alone of each of the memory chips 3B and 48. The area 20 where the data system (DAT) bonding pads are arranged and the area 21 where the bonding pads of the command address clock system (CMD-ADR-CK) are arranged are separated. The memory chips 4B and 3B may be provided such that respective one sides are shifted in parallel, and the bonding pads of the lower memory chip 3B may be exposed. The area 20 where the data system bonding pads are arranged is, as described above, opposed to the bonding pad array 11A of the data and strobe signal system of the data processor chip 2B, which makes it easier to equalize the data wirings and to shorten the path lengths. As compared with the case of FIG. 5, it is possible to somewhat shorten the wiring length of the command address clock system. Other structures are the same as those of the semiconductor device 1 and the detailed description thereof is omitted.

While the invention made above by the present inventors has been described specifically on the basis of the preferred embodiments, the present invention is not limited to the embodiments referred to above. It is needless to say that various changes can be made thereto within the scope not departing from the gist thereof.

For instance, the memory chip is not limited to a MOBILE-DDR or a DDR2-SDRAM, and it may be a DDR3-SDRAM performing a fast-speed operation, or a less-fast DDR-SDRAM. Alternatively, the memory chip may be, as a clock-synchronous type chip, a synchronous SRAM, a flash memory, etc. The data processor chip may be a microcomputer. Also, the data processor chip may be an accelerator in charge of specific data processing such as image processing, voice processing. encryption decoding, and communications protocol processing, or a system-on-chip type semiconductor chip called SOI. That is, it may be the one which comprises a memory-interface function for controlling an access control of the memory chip and performs data processing. The number of simultaneous-access data bits is not limited to 64, and it may be changed as required. The number of memory chips is not limited to two, and there may be mounted a plurality of sets each containing two stacked memory chips. The configuration for external connection, such as the number of wiring layers and a BGA of the module board, can be changed as required.

What is claimed is:

1. A semiconductor device comprising:
a module board including an upper surface, a plurality of first bonding leads formed on the upper surface, a plurality of second bonding leads formed on the upper surface, a plurality of substrate wirings electrically connecting the first bonding leads with the second bonding leads, and a lower surface opposite to the upper surface;
a first memory chip including a first front surface, a plurality of first bonding pads formed on the first front surface, and a first rear surface opposite to the first front surface, and mounted over the upper surface of the module board such that the first rear surface of the first memory chip faces to the upper surface of the module board;
a data processor chip including a main surface, a plurality of bonding pads formed on the main surface, and a back surface opposite to the main surface, and mounted over the upper surface of the module board such that the back surface of the data processor chip faces to the upper surface of the module board, and arranged next to the first memory chip in a plan view;
a plurality of first wires electrically connecting the bonding pads of the data processor chip with the first bonding leads of the module board, respectively;
a plurality of second wires electrically connecting the first bonding pads of the first memory chip with corresponding second bonding leads of the module board, respectively;
a resin sealing the first memory chip, the data processor chip, the first wires and the second wires; and
a plurality of ball electrodes formed over the lower surface of the module board;
wherein the first bonding leads include inside bonding leads arranged between the data processor chip and the first memory chip in the plan view, and outside bonding leads arranged between the inside bonding leads and the first memory chip in the plan view;
wherein the first front surface in the plan view of the first memory chip is quadrangular having a first side;
wherein the first bonding pads of the first memory chip include a plurality of first data system bonding pads arranged along the first side, and a plurality of first data strobe bonding pads;
wherein the main surface in the plan view of the data processor chip is quadrangular having a second side;
wherein the bonding pads of the data processor chip include a plurality of data system bonding pads arranged along the second side, a plurality of data strobe bonding pads arranged along the second side, a plurality of power supply bonding pads arranged along the second side, and a plurality of ground bonding pads arranged along the second side;

wherein the first memory chip is mounted over the upper surface of the module board such that the first side faces to the second side in the plan view;

wherein the data system bonding pads of the data processor chip are electrically connected with the first data system bonding pads of the first memory chip via a plurality of data system wires of the first wires, some of the outside bonding leads, a plurality of first substrate wirings of the substrate wirings, and some of the second bonding leads, respectively;

wherein the data strobe bonding pads of the data processor chip are electrically connected with the first data strobe bonding pads of the first memory chip via a plurality of data strobe wires of the first wires, some of the inside bonding leads, a plurality of second substrate wirings of the substrate wirings, and some of the second bonding leads, respectively;

wherein the first substrate wirings are formed on one of the upper surface and the lower surface; and wherein the second substrate wirings are formed on other of the upper surface and the lower surface.

2. A semiconductor device according to claim 1, wherein the power supply bonding pads are electrically connected with some of the outside bonding leads via a plurality of power supply wires of the first wires, respectively; and wherein the power supply wires are arranged over the data strobe wires, respectively.

3. A semiconductor device according to claim 1, wherein the ground bonding pads are electrically connected with some of the outside bonding leads via a plurality of ground wires of the first wires, respectively; and wherein the ground wires are arranged over the data strobe wires, respectively.

4. A semiconductor device according to claim 1, wherein a second memory chip including a second front surface, a plurality of second bonding pads formed on the second front surface, and a second rear surface opposite to the second front surface is mounted over the first memory chip such that the second rear surface of the second memory chip faces to the first front surface of the first memory chip;

wherein the second memory chip is the same type as the first memory chip;

wherein a plurality of third wires electrically connect the second bonding pads of the second memory chip with corresponding second bonding leads of the module board, respectively;

wherein the data processor chip is capable of simultaneously accessing the first and second memory chips;

wherein the second front surface in the plan view of the second memory chip is quadrangular having a third side;

wherein the second bonding pads of the second memory chip include a plurality of second data system bonding pads arranged along the third side; and wherein each of the first and second memory chips is mounted over the upper surface of the module board such that each of the first and third sides faces to the second side in the plan view.

5. A semiconductor device according to claim 4, wherein a spacer is mounted over the first front surface of the first memory chip; and wherein the second memory chip is mounted over the spacer such that the second rear surface of the second memory chip faces to the spacer.

* * * * *